(12) United States Patent
Yang et al.

(10) Patent No.: US 7,755,894 B2
(45) Date of Patent: Jul. 13, 2010

(54) HEAT DISSIPATION DEVICE

(75) Inventors: Ping-An Yang, Shenzhen (CN); Meng Fu, Shenzhen (CN); Shi-Wen Zhou, Shenzhen (CN); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1018 days.

(21) Appl. No.: 11/309,344

(22) Filed: Jul. 28, 2006

(65) Prior Publication Data

US 2007/0215321 A1    Sep. 20, 2007

(30) Foreign Application Priority Data

Mar. 16, 2006    (CN)    ......................... 2006 1 0034554

(51) Int. Cl.
    *H05K 7/20*    (2006.01)
(52) U.S. Cl. ...................... 361/700; 165/80.3
(58) Field of Classification Search ............. 165/104.33
    See application file for complete search history.

(56) References Cited

U.S. PATENT DOCUMENTS 5,283,715 A    2/1994    Carlsten et al.

| 7,000,687 | B2 * | 2/2006 | Ying et al. | ............. 165/104.33 |
| 7,227,752 | B2 * | 6/2007 | Xia et al. | ..................... 361/700 |
| 7,278,470 | B2 * | 10/2007 | Xia et al. | ............... 165/104.33 |
| 7,520,316 | B2 * | 4/2009 | Xia et al. | ............... 165/104.33 |
| 2004/0170000 | A1 * | 9/2004 | Fujiwara et al. | ............. 361/719 |
| 2007/0074857 | A1 * | 4/2007 | Xia et al. | ............... 165/104.33 |
| 2007/0107876 | A1 * | 5/2007 | Xia et al. | ............... 165/104.26 |
| 2007/0131387 | A1 * | 6/2007 | Kawabata et al. | .......... 165/80.3 |

FOREIGN PATENT DOCUMENTS

TW    M267830    6/2005

* cited by examiner

*Primary Examiner*—Allen J Flanigan
(74) *Attorney, Agent, or Firm*—Jeffrey T. Knapp

(57) ABSTRACT

A heat dissipation device includes a first base plate having a flat top surface, a plurality of flattened heat pipes, a fin assembly located above the heat pipes and a thermally conductive layer formed between the heat pipes and the fin assembly. The thermally conductive layer has a flat surface contacting with the heat pipes. The heat pipes are supported on the top surface of the first base plate. The first base plate has a flat bottom surface for engaging with an electronic package. Each heat pipe comprises an evaporating section and a condensing section bent from the evaporating section, and the evaporating sections of the heat pipes abut side by side against each other.

20 Claims, 3 Drawing Sheets

HEAT DISSIPATION DEVICE

FIELD OF THE INVENTION

The present invention relates to a heat dissipation device, more particularly to a heat dissipation device using heat pipes for enhancing heat removal from heat generating electronic devices.

DESCRIPTION OF RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and a heat pipe. The heat sink comprises a base and a plurality of fins extending from the base. The base defines a groove in a top surface thereof, and a bottom surface of the base is attached to an electronic component. Each heat pipe has an evaporating portion accommodated in the groove and a condensing portion inserted in the fins. The base absorbs heat produced by the electronic component and transfers the heat directly to the fins through the heat pipe. By the provision of the heat pipe, heat dissipation efficiency of the heat dissipation device is improved.

However, the groove has to be first formed on the top surface of the base so as to receive the evaporating portion of the heat pipe. The base has to be thick so as to form the groove thereon, and this leads to an increase in cost. Furthermore, it is a waste to cut material off the base to form the groove. Therefore, it is desirable to provide a heat dissipation device that eliminates the aforesaid drawbacks.

SUMMARY OF THE INVENTION

A heat dissipation device comprises a first base plate having a flat top surface, a plurality of flattened heat pipes, a fin assembly located above the heat pipes and a thermally conductive layer formed between the heat pipes and the fin assembly. The thermally conductive layer has a flat surface contacting with the heat pipes. The heat pipes are supported on the top surface of the first base plate. Each heat pipe comprises an evaporating section and a condensing section bent from the evaporating section, and the evaporating sections of the heat pipes abut side by side against each other and thermally connect with the first base plate. The condensing sections thermally connect with the thermally conductive layer.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
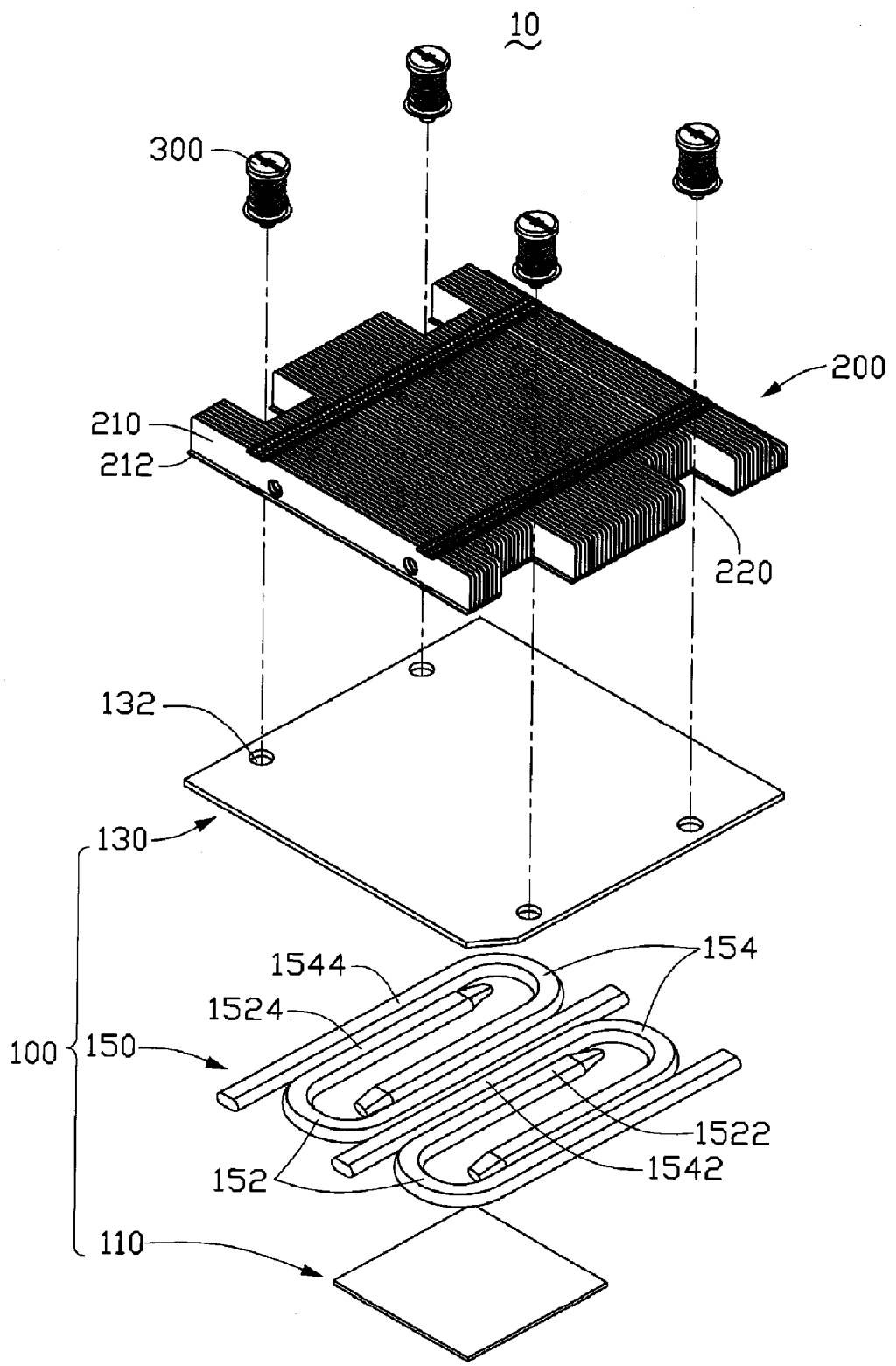
FIG. 1 is an exploded view of a heat dissipation device in accordance with a preferred embodiment of the present invention.
Figure 2:
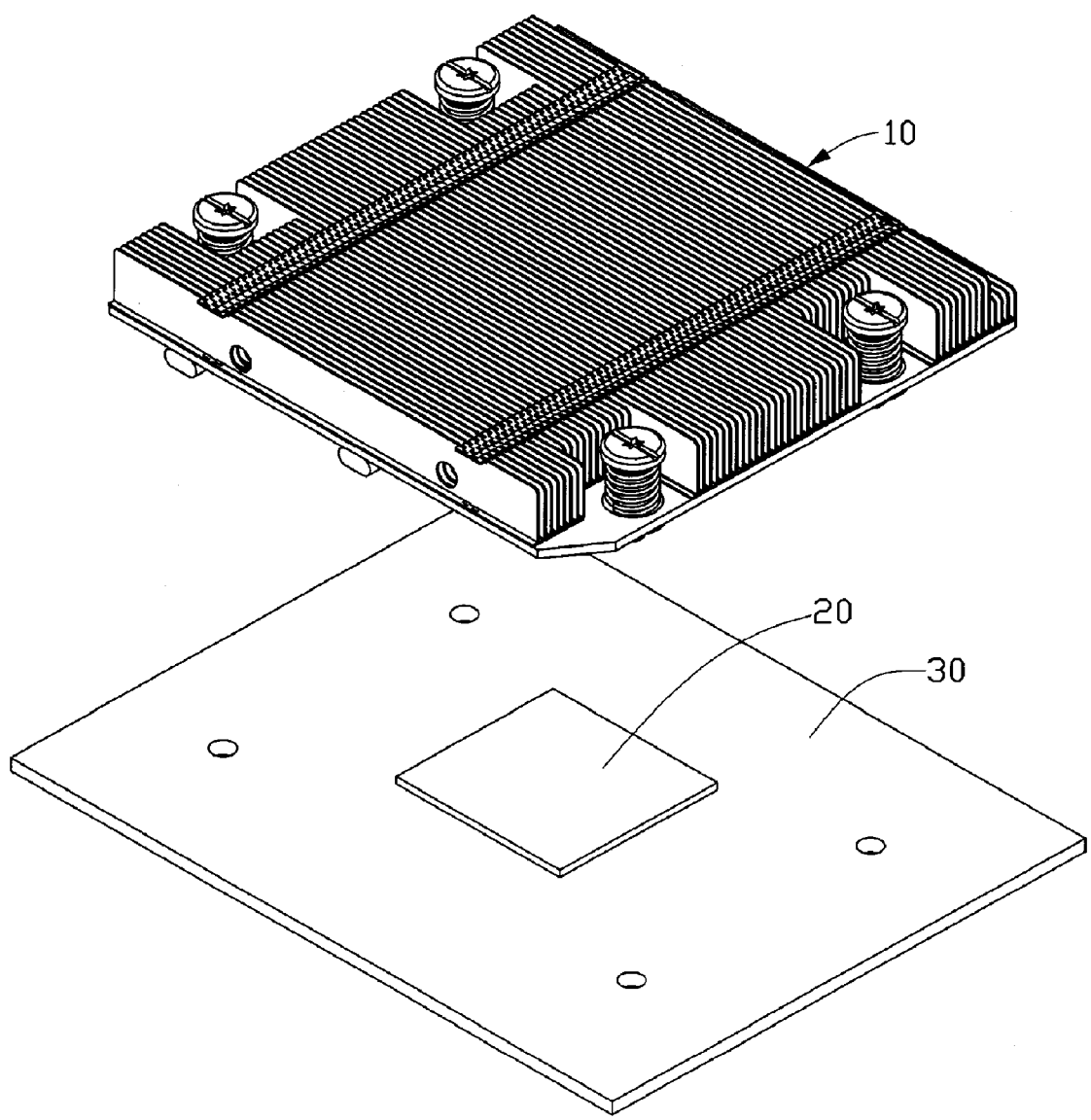
FIG. 2 is an assembled view of the heat dissipation device in FIG. 1, together with an electronic package mounted on a printed circuit board.
Figure 3:
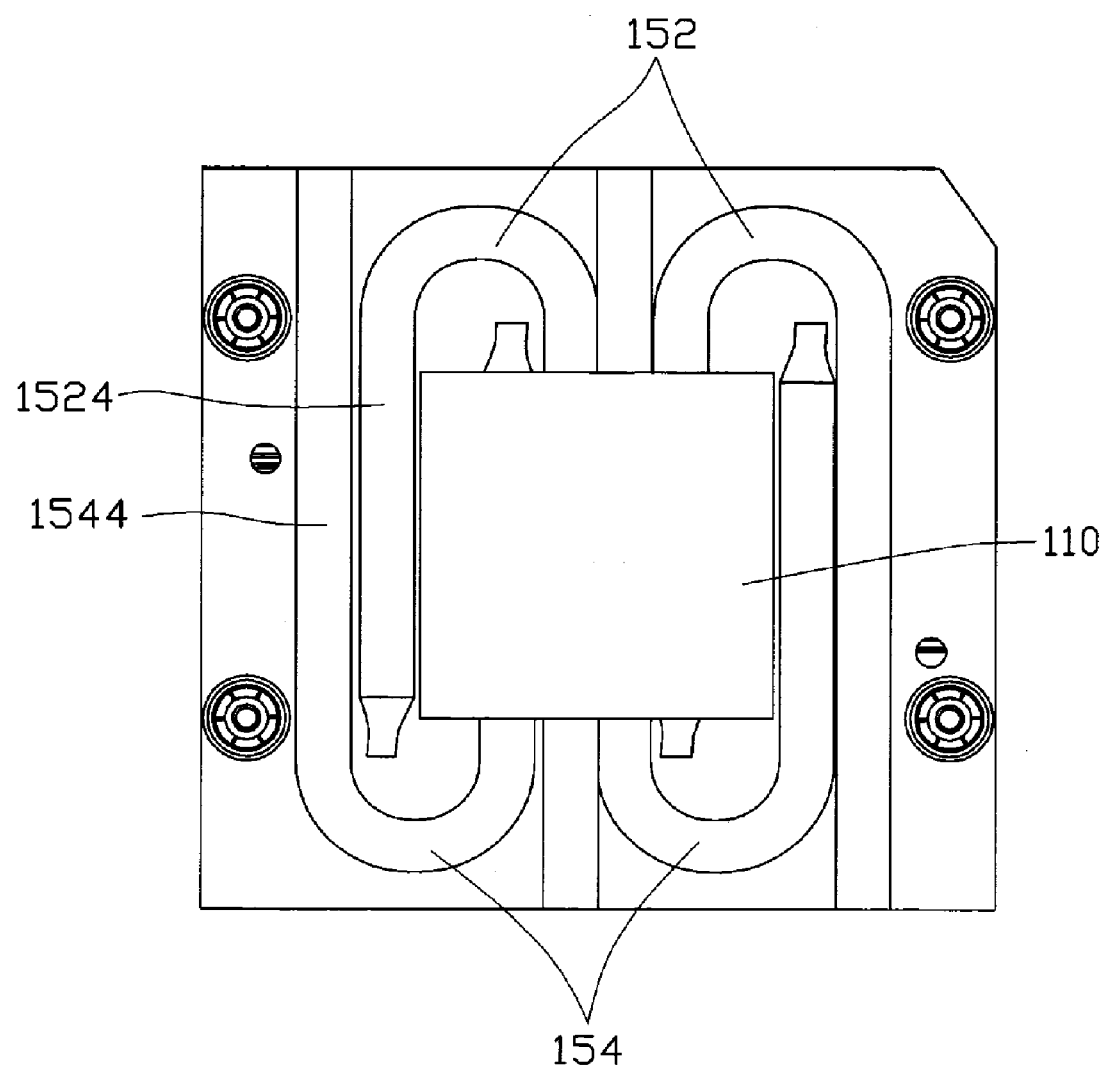
FIG. 3 is a bottom view of the heat dissipation device in FIG. 2.

Referring to FIGS. 1-3, a heat dissipation device 10 in accordance with a preferred embodiment of the present invention is illustrated. The heat dissipation device 10 is used to cool down an electronic package such as a central processing unit (CPU) 20 mounted on a printed circuit board 30; it comprises a base 100, a fin assembly 200 mounted on the base 100 and four fasteners 300 used for securing the heat dissipation device 10 onto the CPU 20. The base 100 comprises a first base plate 110, a second base plate 130 parallel to the first base plate 110, and four flattened heat pipes 150 sandwiched between the first and second base plates 110, 130 and separating the second base plate 130 from the first base plate 110. The four heat pipes 150 can be divided into two pairs, namely two first heat pipes 152 and two second heat pipes 154.

The first base plate 110 is substantially rectangular, and made of thermal conductive material such as copper or aluminum. The first base plate 110 is a flat member having a flat top surface supporting the heat pipes 150 and a flat bottom surface for directly contacting with the CPU 20 to absorbing heat therefrom. In this embodiment, the first base plate 110 is larger than the CPU 20 and smaller than the second base plate 130, which avails to reduce the cost of the heat dissipation device 10.

The second base plate 130 is also substantially rectangular, and made of thermal conductive material such as copper, aluminum. A through hole 132 is defined in each corner of the second base plate 130 for the fasteners 300 extending therethough to secure the heat dissipation device 10 onto a top surface of the CPU 20. The second base plate 130 is also a flat member having a flat top surface supporting the fin assembly 200 and a flat bottom surface facing the heat pipes 150.

The heat pipes 150 are U shaped. Each heat pipe 152, 154 comprises two separate parallel arms, which are in different length and are respectively functioned as an evaporating section 1522, 1542 and a condensing section 1524, 1544.

The heat pipes 152, 154 are assembled on the first base plate 110 and the second base plate 130 by soldering or adhering to form the base 100. When the base 100 is formed, the heat pipes 152, 154 are hooked one-inside-the-other, with the evaporating sections 1522, 1542 thereof abutting side by side against each other. The first heat pipes 152 are so oriented that they open to a same direction; and the second heat pipes 154 are so oriented that they open to a direction opposite to that of the first heat pipes 152. The evaporating sections 1522 of the first heat pipes 152 and the evaporating sections 1542 of the second heat pipes 154 are alternately arranged, and are located between the condensing sections 1524, 1544 of the heat pipes 152, 154. The condensing sections 1524 of the first heat pipes 152 closely contact adjacent condensing sections 1544 of the second heat pipes 154. In this embodiment, only the evaporating sections 1522, 1542 of the first and second pipes 1524, 1544 are fixed to the first base plate 110 to absorb heat therefrom; while the condensing sections 1524, 1544 of the first and second heat pipes 152, 154 spread out from the first base plate 110 and extend to reach other parts of the second base plate 130.

Thus, heat originating from the CPU 20 is absorbed by the first base plate 110 and conducted to the evaporating sections 1522, 1542 of the first and second heat pipes 152, 154, where it can then quickly spread to the second base plate 130 by the condensing sections 1524, 1544 of the heat pipes 152, 154. So a uniform temperature distribution in the second base plate 130 is achieved. This allows uniform transfer of heat from the second base plate 130 to the fin assembly 200 to improve the heat dissipation of the fin assembly 200; thus, the efficiency of the heat dissipation device 10 is promoted.

The fin assembly 200 comprises a plurality of individual fin plates 210 arranged side by side. Each fin plate 210 is made of a highly thermally conductive material such as aluminum or copper. Each fin plate 210 has a flange 212 bent from a bottom edge thereof, and the flanges 212 of the fin plates 210 are formed so as to be coplanar with each other to form a flat bottom surface. The fin assembly 200 can be mounted on the top surface of the second base plate 130. The fin plates 210 are arranged on the second base plate 130 at a predetermined interval and perpendicular to a direction which the arms of the heat pipes 152, 154 extend along. In other words, the fin plates 210 extend vertically while the heat pipes 152, 154 are arranged on a horizontal plane. Furthermore, four depressions 220 are defined in the fin assembly 200 corresponding to the through holes 132 defined in the second base plate 130 for facilitating installation of the fasteners 300. In another embodiment, the flat bottom surface of the fin plates 200 can serve as the second base plate 130, and the fin plates 210 can be directly mounted onto the heat pipes 152, 154 without the second base plate 130.

As described above, the top surface of the first base plate 110 and the bottom surface of the second base plate 130 are flat without the presence of the groove which exists in the conventional heat dissipation device. Thus, the first base plate 110 can be manufactured to be very thin to reduce the cost. Furthermore, the condensing sections 1524, 1544 of the heat pipes 152, 154 are bent from the evaporating section 1522, 1542 of the heat pipes 152, 154 and spread on the second base plate 130. This serves to uniformly transfer the heat from the second base plate 130 to the fin assembly 200 and to improve the utilization of the fin assembly 200 to dissipate the heat.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a first base plate having a flat top surface and a flat bottom surface adapted for connecting with a heat-generating electronic component;
   two first heat pipes and two second heat pipes, each of the first and second heat pipes being generally U-shaped and comprising two straight arms, the first and second heat pipes being supported on the top surface of the first base plate;
   a fin assembly located above the first and second heat pipes; and
   a thermally conductive layer formed between the first and second heat pipes and the fin assembly, the thermal conductive layer having a flat surface contacting the first and second heat pipes;
   wherein the first and second heat pipes are arranged side by side such that the straight arms of the first and second heat pipes are substantially parallel to each other and arranged alternately one straight arm after another.

2. The heat dissipation device as claimed in claim 1, wherein the thermally conductive layer comprises a second base plate parallel to the first base plate, the second base plate comprising a flat bottom surface in contact with the first and second heat pipes.

3. The heat dissipation device as claimed in claim 1, wherein each of the first and second heat pipes is flat, and the first and second heat pipes are arranged on a plane.

4. The heat dissipation device as claimed in claim 1, wherein each of the first heat pipes is oriented such that an open end of the U-shape points in a first direction, and each of the second heat pipes is oriented such that an open end of the U-shape points in a second direction different from the first direction.

5. The heat dissipation device as claimed in claim 2, wherein the straight arms of each of the first and second heat pipes are an evaporating section and a condensing section, respectively, the evaporating sections of the first and second heat pipes being arranged and abutting one another side by side to form four consecutively parallel evaporating sections thermally connecting with the first base plate, the condensing sections of the first and second heat pipes thermally connecting with the thermally conductive layer.

6. The heat dissipation device as claimed in claim 2, wherein the first base plate is smaller than the second base plate.

7. The heat dissipation device as claimed in claim 5, wherein the evaporating sections of the first and second heat pipes are fixed to the first base plate, while the condensing sections of the first and second heat pipes spread out from the first base plate and extend to reach the second base plate.

8. The heat dissipation device as claimed in claim 5, wherein the evaporating sections of the first and second heat pipes are located between the condensing sections of the first and second heat pipes.

9. The heat dissipation device as claimed in claim 2, wherein a through hole is defined in each corner of the second base plate for a fastener to extend therethough.

10. The heat dissipation device as claimed in claim 9, wherein four depressions are defined in the fin assembly corresponding to the through holes of the second base plate.

11. The heat dissipation device as claimed in claim 2, wherein the fin assembly comprises a plurality of individual fin plates arranged side by side, the fin plates comprise a plurality of flanges extending from bottom edges thereof, and the flanges of the fin plates are coplanar with each other and thermally connect with a flat top surface of the second base plate.

12. The heat dissipation device as claimed in claim 3, wherein the fin plates are oriented perpendicularly to the plane on which the heat pipes are arranged.

13. A base for removing heat from an electronic package, the base comprising:
    a first base plate having a flat top surface, and a flat bottom surface adapted for engaging with the electronic package;
    two first heat pipes and two second heat pipes, each of the first and second heat pipes being generally U-shaped and comprising two straight arms, the first and second heat pipes being supported on the top surface of the first base plate, and a second base plate parallel to the first base plate and comprising a flat bottom surface in contact with the first and second heat pipes;

wherein the first and second heat pipes are arranged side by side such that the straight arms of the first and second heat pipes are substantially parallel to each other and arranged alternately one straight arm after another.

14. The base as claimed in claim 13, wherein the straight arms of each of the first and second heat pipes are an evaporating section and a condensing section, respectively, the evaporation sections of the first and second heat pipes being arranged and abutting one another side by side, the condensing sections of the first and second heat pipes being arranged side by side.

15. The base as claimed in claim 13, wherein each of the first and second heat pipes is flat, and the first and second heat pipes are arranged on a plane.

16. The heat dissipation device as claimed in claim 15, wherein each of the first heat pipes is oriented such that an open end of the U-shape points in a first direction, and each of the second heat pipes is oriented such that an open end of the U-shape points in a second direction opposite to the first direction.

17. An electronic assembly comprising:
a printed circuit board;
an electronic package mounted on the printed circuit board;
a first flat plate having a flat bottom surface engaging with the electronic package and a flat top surface;
two pairs of U-shaped heat pipes, each heat pipe having an evaporating section engaging with the flat top surface of the first flat plate, a condensing section substantially parallel to the evaporation section, and a bent section connecting the evaporation section and the condensing section, wherein in each pair of the heat pipes, one of the heat pipes is inverted with respect to the other of the heat pipes in a manner that the evaporation sections thereof are arranged and abut against one another side by side, and the condensing sections thereof are in contact with each other, whereby each pair of the heat pipes cooperatively forms a substantially closed thermal loop; and
a fin assembly having a bottom surface thermally connecting with the condensing sections of the pairs of heat pipes, wherein the pairs of heat pipes are sandwiched between the fin assembly and the first flat plate.

18. The electronic assembly of claim 17, further comprising a second flat plate sandwiched between the condensing sections of the pairs of heat pipes and the bottom surface of the fin assembly, the second flat plate thermally connecting the condensing sections of the pairs of heat pipes and the bottom surface of the fin assembly together.

19. The electronic assembly of claim 18, wherein the second flat plate is larger than the first flat plate, the evaporation sections of the pairs of heat pipes thermally connecting with the top flat surface of the first flat plate, and the condensing sections of the at least two heat pipes spreading out from the first flat plate.

20. The heat dissipation device as claimed in claim 13, wherein the two straight arms of each of the first and second heat pipes have different lengths.

* * * * *